(12) United States Patent
Fossum

(10) Patent No.: US 10,674,098 B1
(45) Date of Patent: Jun. 2, 2020

(54) IMAGE SENSOR HAVING SUB-DIFFRACTION-LIMIT PIXELS

(71) Applicant: Rambus Inc., Sunnyvale, CA (US)

(72) Inventor: Eric R. Fossum, Wolfeboro, NH (US)

(73) Assignee: Rambus Inc., Sunnyvale, CA (US)

( * ) Notice: Subject to any disclaimer, the term of this patent is extended or adjusted under 35 U.S.C. 154(b) by 292 days.

(21) Appl. No.: 15/390,686

(22) Filed: Dec. 26, 2016

Related U.S. Application Data

(63) Continuation of application No. 14/947,215, filed on Nov. 20, 2015, now Pat. No. 9,565,385, which is a continuation of application No. 14/056,752, filed on Oct. 17, 2013, now Pat. No. 9,225,918, which is a continuation of application No. 11/442,458, filed on May 26, 2006, now Pat. No. 8,648,287.

(60) Provisional application No. 60/685,216, filed on May 27, 2005.

(51) Int. Cl.
| | |
|---|---|
| *H04N 5/353* | (2011.01) |
| *H04N 5/347* | (2011.01) |
| *H04N 5/378* | (2011.01) |
| *H04N 5/374* | (2011.01) |
| *H04N 9/04* | (2006.01) |

(52) U.S. Cl.
CPC ............ *H04N 5/347* (2013.01); *H04N 5/378* (2013.01); *H04N 5/374* (2013.01); *H04N 9/045* (2013.01); *H04N 2209/045* (2013.01)

(58) Field of Classification Search
CPC ..... H04N 5/535; H04N 5/3696; H04N 5/3745
USPC .......... 250/208.1, 214 R; 348/294, 302, 308, 348/332; 382/284, 299, 303
See application file for complete search history.

(56) References Cited

U.S. PATENT DOCUMENTS

| | | |
|---|---|---|
| 4,446,373 A | 5/1984 | Denholm et al. |
| 5,515,181 A | 5/1996 | Iyoda et al. |
| 5,535,147 A | 7/1996 | Jacobs et al. |
| 5,633,958 A | 5/1997 | Kato |
| 5,665,959 A | 9/1997 | Fossum et al. |
| 5,786,623 A | 7/1998 | Bergemont et al. |
| 5,867,215 A | 2/1999 | Kaplan |
| 5,909,026 A | 6/1999 | Zhou et al. |
| 5,949,483 A | 9/1999 | Fossum et al. |
| 5,956,141 A | 9/1999 | Hayashi |
| 6,097,022 A | 8/2000 | merrill et al. |
| 6,240,219 B1 | 5/2001 | Gregory |
| 6,296,387 B1 | 10/2001 | Guillemaud |
| 6,313,455 B1 | 11/2001 | Afghahi |

(Continued)

FOREIGN PATENT DOCUMENTS

WO WO-2004/099865 A2 11/2004

OTHER PUBLICATIONS

"New Sony Sensor Achieves Industry Smallest Pixel Size," May 25, 2010, http://www.dcviews.com/press/sony-14mp.htm, p. 1-2. 2 pages.

(Continued)

*Primary Examiner* — Kevin K Pyo
(74) *Attorney, Agent, or Firm* — Charles Shemwell

(57) ABSTRACT

An imaging system has an imager comprising a plurality of jots. A readout circuit is in electrical communication with the imager. The readout circuit can be configured to facilitate the formation of an image by defining neighborhoods of the jots, wherein a local density of exposed jots within a neighborhood is used to generate a digital value for a pixel of the image.

20 Claims, 4 Drawing Sheets

(56) References Cited

U.S. PATENT DOCUMENTS

| | | | |
|---|---|---|---|
| 6,552,745 | B1 | 4/2003 | Perner |
| 6,552,746 | B1 | 4/2003 | Yang et al. |
| 6,665,012 | B1 | 12/2003 | Yang et al. |
| 6,665,013 | B1 | 12/2003 | Fossum et al. |
| 6,704,046 | B2 | 3/2004 | Dyas et al. |
| 6,791,611 | B2 | 9/2004 | Yang |
| 7,023,369 | B2 | 4/2006 | Bocko et al. |
| 7,095,439 | B2 | 8/2006 | Hammadou |
| 7,109,488 | B2 | 9/2006 | Milton |
| 7,230,224 | B2 | 6/2007 | Kondo et al. |
| 7,242,478 | B1 | 7/2007 | Dombrowski et al. |
| 7,268,814 | B1 | 9/2007 | Pain et al. |
| 7,630,065 | B2 | 12/2009 | Suzuki et al. |
| 7,858,917 | B2 | 12/2010 | Stern et al. |
| 7,956,912 | B2 | 6/2011 | Berezin |
| 8,648,287 | B1 | 2/2014 | Fossum |
| 9,294,690 | B1 * | 3/2016 | Caulfield ............... H04N 5/33 |
| 9,565,385 | B1 * | 2/2017 | Fossum ............... H04N 5/374 |
| 2001/0024237 | A1 | 9/2001 | Osada et al. |
| 2002/0003201 | A1 | 1/2002 | Yu |
| 2002/0015113 | A1 | 2/2002 | Chauvin et al. |
| 2002/0064789 | A1 | 5/2002 | Weiss et al. |
| 2002/0088952 | A1 | 7/2002 | Rao et al. |
| 2003/0025942 | A1 | 2/2003 | Atkinson |
| 2003/0063487 | A1 | 4/2003 | Steckl et al. |
| 2003/0132365 | A1 | 7/2003 | Cartlidge |
| 2004/0008867 | A1 | 1/2004 | Fein et al. |
| 2004/0036788 | A1 | 2/2004 | Chapman et al. |
| 2004/0041082 | A1 | 3/2004 | Harmon |
| 2004/0066878 | A1 | 4/2004 | Seppi |
| 2004/0096125 | A1 | 5/2004 | Alderson et al. |
| 2004/0159772 | A1 | 8/2004 | Cartlidge et al. |
| 2004/0159773 | A1 | 8/2004 | Fein et al. |
| 2004/0235147 | A1 | 11/2004 | Chappell |
| 2004/0245592 | A1 | 12/2004 | Harmon et al. |
| 2005/0001176 | A1 | 1/2005 | Loney et al. |
| 2005/0012033 | A1 | 1/2005 | Stern et al. |
| 2005/0104003 | A1 | 5/2005 | Jarron |
| 2005/0104632 | A1 | 5/2005 | Lettvin |
| 2005/0285822 | A1 | 12/2005 | Reddy et al. |
| 2006/0072104 | A1 | 4/2006 | Engel et al. |
| 2006/0081887 | A1 | 4/2006 | Lyu |
| 2006/0084195 | A1 | 4/2006 | Lyu |
| 2006/0106306 | A1 | 5/2006 | Essner et al. |
| 2008/0025462 | A1 | 1/2008 | Sutko et al. |
| 2008/0158566 | A1 | 7/2008 | Suzuki et al. |
| 2008/0180784 | A1 | 7/2008 | Silverstein et al. |
| 2009/0135114 | A1 | 5/2009 | White et al. |
| 2009/0152681 | A1 | 6/2009 | Zheng et al. |
| 2010/0127156 | A1 | 5/2010 | Yokogawa |
| 2010/0198061 | A9 | 8/2010 | Daghighian et al. |
| 2010/0252716 | A1 | 10/2010 | Kalevo et al. |
| 2010/0320369 | A1 | 12/2010 | Koskinen et al. |
| 2010/0321542 | A1 * | 12/2010 | Koskinen .......... H01L 27/14621 348/273 |
| 2012/0218445 | A1 | 8/2012 | Petilli |
| 2014/0103190 | A1 | 4/2014 | Lee et al. |

OTHER PUBLICATIONS

"Photodiode", Wikipedia entry, last modified Jan. 17, 2012, http://en.wikipedia.org/wiki/Photodiode. 7 pages.

"Photoelectrons", printed from http://www.thefreedictionary.com/photoelectrons on Jan. 17, 2012. 2 pages.

Acosta-Serafini, Pablo M. et al, "A 1/3" VGA Linear Wide Dynamic Range CMOS Image Sensor Implementing a Predictive Multiple Sampling Algorithm With Overlapping Integration Intervals", IEEE Journal of Solid-State Circuits, vol. 39, No. 9, Sep. 2004, pp. 1487-1496.

Agranov, G., et al., "Super Small, Sub 2um Pizels for Novel CMOS Image Sensors," 2007 International Image SensorWorkshop, pp. 307-310, Jun. 7-10, 2007. 4 pages.

Bermak, Amine, et al., "A Vision Sensor with On-Pixel ADC and In-Built Light Adaptation Mechanism," Microelectronics Jounal 33 (2002), accepted Jul. 23, 2002. 6 pages.

Davis, Lloyd M., et al., "Imaging of Single-Chromophore Molecules in Aqueous Solution Near a Fused-Silica Interface," Multiphoton Microscopy in the Biomedical Sciences, Proceedings of SPIE, vol. 4262 (2001). 11 pages.

Fairchild Semiconductor Corporation, "Application Note AN-3005 Design Fundamentals for Phototransistor Circuits", 2002. www.fairchildsemi.com/an/AN/AN-3005.pdf. 2 pages.

Fife, K., et al., "A 0.5um Pixel Frame-Transfer CCD Image Sensor in 110nm CMOS," Dec. 2007, Electron Devices Meeting, 2007, IEDM 2007, IEEE International. pp. 1003-1006. 4 pages.

Fitzgerald, AJ, et al., "An Introduction to Medical Imaging with Coherent Terahertz Frequency Radiation," Mar. 2002, Phys. Med. Biol. 47 (2002) R67-R84. 18 pages.

Forchheimer et al., "A Single Chip Linear Array Picture Processor," 1983, Processor, In Applications of digital image processing, SPIE, pp. 425-430. 6 pages.

Forchheimer, Robert, "MAPP2200—A Second Generation Smart Optical Sensor," 1992, SPIE Image Processing and Interchange, vol. 1659, pp. 2-11. 10 pages.

Fortier, Justin et al., "1.2 V O.18um CMOS Imager with Column-Level Oversampling", Department of Electronics, Carleton University, Ottawa, Canada, KIS 5B6. IEEE Solid State Circuits Conference 2001. 4 pages.

Fossum, E. R., "Gigapixel Digital Film Sensor (DFS) Proposal," Nanospace Manipulation of Photons and Electrons for Nanovision 3 Systems, The 7th Takayanagi Kenjiro Memorial Symposium and the 2nd International Symposium on Nanovision Science, University of Shizuoka, Hamamatsu, Japan, Oct. 25-26, 2005, pp. 1-5. 5 pages.

Fossum, Eric R., "CMOS Active Pixel Image Sensors: Past, Present, and Future," 2008, http://ericfossum.com/Presentations/2008%20Jan%20CMOS%20Image%20Sensors%20Past%20Present%20ar pp. 1-86. 86 pages.

Fossum, Eric R., "What to Do With Sub-Diffraction-Limit (SDL) Pixels?—A Proposal for a Gigapixel Digital Film Sensor (DFS)," 2004, Discussion Session, pp. 214-217. 4 pages.

Fossum, Eric, "Image Sensors Past Present and Future," News Discussion Forum: Digital Photography Review, http://forums.dpreview.com/forums/read.asp?forum=1000&message=28545539, Jul. 7, 2008. 1 page.

Fowler, Boyd et al., "A CMOS Area Image Sensor With Pixel Level A/D Conversion", Information Systems Laboratory, Electrical Engineering Department, Stanford University, Stanford, CA, Jun. 21, 2001. 11 pages.

Gol'tsman, G.N., et al., "Picosecond Superconducting Single-Photon Optical Detector," Applied Physics Letters, vol. 79, No. 6, Aug. 6, 2001. 3 pages.

Kavusi et al., "Quantitative Study of High Dynamic Range Image Sensor Architectures," 2004, Department of Electrical Engineering, Stanford University, Stanford, CA 94305. 12 pages.

Kavusi, Sam, et al. "Quantitative Study of High Dynamic Range Sigma Delta-based Focal Plane Array Architectures", Department of Electrical Engineering, Stanford University, Stanford, CA 94305, 2004, pp. 341-350.

Kleinfelder, Stuart, et al., "A 10 000 Frames/s CMOS Digital Pixel Sensor," IEEE Journal of Solid-State Circuits, vol. 36, No. 12, Dec. 2001. 11 pages.

Moerner et al., "Methods of Single-Molecule Fluorescence Spectroscopy and Microscopy," Rev. Sci. Instrum. 74, 3597 (2003), American Institute of Physics. 24 pages.

Niclass, Cristiano L., et al., "A CMOS Single Photon Avalanche Diode Array for 3D Imaging," 2004 IEEE International Solid-State Circuits Conference, Feb. 16, 2004, Salon 10-15, Paper 6.7. 10 pages.

Rambus Inc., "Binary Pixel Imager Technology," Jun. 4, 2013, retrieved from hwwp://www.rambus.com/us/technology/innovations/binary-pixel-imager/index.html. 3 pages.

Rhee, Jehyuk, et al., "Wide Dynamic Range CMOS Image Sensor with Pixel Level ADC," Electronics Letters, Feb. 20, 2003, vol. 39, No. 4. 2 pages.

(56) References Cited

OTHER PUBLICATIONS

Seitz, Peter, "From Electronic Photography to Seeing Chips—The Future of Image Sensing," Advanced Technologies, Intelligent Vision, 1995. 7 pages.

Yang, David X.D., et al., "A Nyquist Rate Pixel Level ADC for CMOS Image Sensors," IEEE 1998 Custom Integrated Circuits Conference. 4 pages.

Yang, David X.D., et al., "A Nyquist-Rate Pixel-Level ADC for CMOS Image Sensors," IEEE Journal of Solid-State Circuits, vol. 34, No. 3, Mar. 1999. 9 pages.

\* cited by examiner

IMAGE SENSOR HAVING SUB-DIFFRACTION-LIMIT PIXELS

CROSS REFERENCE TO RELATED APPLICATIONS

This application is a continuation of U.S. patent application Ser. No. 14/947,215 filed Nov. 20, 2015 (now U.S. Pat. No. 9,565,385), which is a continuation of U.S. patent application Ser. No. 14/056,752 filed Oct. 17, 2013 (now U.S. Pat. No. 9,225,918), which is a continuation of U.S. patent application Ser. No. 11/442,458 filed May 26, 2006 (now U.S. Pat. No. 8,648,287), which claims the benefit of U.S. provisional patent application Ser. No. 60/685,216 filed May 27, 2005. Each of the foregoing applications is hereby incorporated by reference.

TECHNICAL FIELD

The present invention relates generally to solid state imaging. The present invention relates more particularly to the use of sub-diffraction-limit (SDL) pixels for imaging, such as to emulate the contemporary silver halide emulsion film process.

BACKGROUND

The relentless drive to reduce feature size in microelectronics has continued now for several decades and feature sizes have shrunk in accordance with the prediction of Gordon Moore in 1975. While the repeal of Moore's Law has been anticipated for some time, we can still confidently predict that feature sizes will continue to shrink in the near future.

Using the shrinking-feature-size argument, it became clear in the early 1990's that it would be possible to put more than 3 or 4 charge coupled device (CCD) electrodes in a single pixel. Thus, the complementary metal oxide (CMOS) active pixel sensor concept was born. The effective transistor count in most CMOS image sensors has hovered in the 3-4 transistor range, and if anything, is being reduced as pixel size is shrunk by shared readout techniques.

The underlying reason for pixel shrinkage is to keep sensor and optics costs as low as possible as pixel resolution grows. Camera size has recently become highly important in the rapidly expanding camera-phone marketplace. Concomitant with the miniaturization of camera components such as sensors and optics is the miniaturization of optical system components such as actuators for auto-focus and zoom in megapixel camera phones.

We are now in an interesting phase in the development of image sensors for both CCDs and CMOS active pixel sensors. The physical dimensions of the pixel are becoming smaller than the diffraction limit of light at the wavelengths of interest. A perfect lens can only focus a point of light to a diffraction-limited spot, known as an Airy disk and the Airy disk is surrounded by higher order, diffraction rings. The Airy disk diameter D A is given by the equation:

$$DA = 2.44 \lambda F\#$$

Where $\lambda$ is the wavelength and F# is the F-number of the optical system.

For example, at 550 nm, and F-number of 2.8, the Airy disk diameter is 3.7 µm. Yet, pixel sizes in megapixel image sensors are at this size and smaller today. We refer to pixel sizes smaller than the 550 nm Airy disk diameter as sub-diffraction-limit (SDL) pixels.

Today it is readily possible to build a 6-T SRAM cell in less than 0.7 µm² using 65 nm CMOS technology. Smaller device are being prototyped. However, significant issues exist for a 0.25 µm² pixel, even though it might be tempting to make a 2 megapixel sensor with 1 mm diagonal using such small pixels. For example, the resolution of the sensor would be well beyond the diffraction limit. In fact, over 40 pixels would fit inside the Airy disk and well over a billion pixels (one gigapixel) can fit on a single chip. Although it is possible to construct such an imager, contemporary imagers do not take advantage of this possibility. Further, contemporary practice does not contemplate the best ways to implement such a device.

In view of the foregoing, it is beneficial to provide implementations and practical applications for such SDL pixels. More particularly, it is desirable to provide a method for providing a digital film sensor that emulates, at least to some degree, contemporary silver halide film.

BRIEF SUMMARY

Systems and methods are disclosed herein to provide a digital film sensor (DFS), such as a gigapixel DFS. In this manner, the contemporary silver halide process can, at least to some degree, be emulated.

For example, in accordance with an embodiment of the present invention, an imaging system can comprise an imager having a plurality of sub-diffraction-limit pixels, referred to herein as jots. The imaging system can also comprise a readout circuit that is in electrical communication with the imager. The readout circuit can be configured to form an image by defining neighborhoods of the jots. A local density of exposed jots within a neighborhood can be used to generate a digital value for a single pixel of the image. That is, the digital value can depend upon how many jots within a neighborhood have been exposed (registered a hit by a photon).

A neighborhood can comprise either a single jot or a plurality of jots. Every neighborhood does not necessarily comprise the same number jots. A neighborhood can comprise any desired number of jots. For example, some neighborhoods can comprise one jot, other neighborhoods can comprise two jots, yet other neighborhoods can comprise three jots, and yet other neighborhoods can comprise more than three jots.

A neighborhood can comprise a plurality of jots from a single exposure (a single frame). Alternatively, a neighborhood can comprise a plurality of jots from a plurality of exposures. The number of jots used to define a neighborhood is variable. A jot may belong to one neighborhood for one exposure and to a different neighborhood for another exposure.

The number of jots used to define a neighborhood can be variable according to a region growing process. The number of jots used to define a neighborhood can be variable according to either a spatial or a temporal region growing process. The number of jots used to define a neighborhood can be variable according to both a spatial and a temporal region growing process.

The region growing process can be a process whereby the size of the neighborhood is determined dynamically. That is, various sizes of neighborhoods are tried and the size providing the best results is used to form an image. For example, the size of each neighborhood can be increased until a resolution maximum is defined and the neighborhood size that provides the resolution maximum can be used to form the image. An image can be divided into any desired number of sub-images and the region growing process can be performed independently for each sub-image.

The neighborhoods can have different sizes as a result of this region growing process. For example, neighborhoods comprised of single jots may provide maximum resolution in one portion of an image, while neighborhoods comprised of four jots may provide maximum resolution in another part of an image.

Each jot can be sensitive to a single photon of light. Alternatively, each jot can require more than one photon to register a hit. The size of the jots within an imager does not have to be uniform. Each jot can be read out as a logical "1" or a logical "0".

The imager can comprise color filters covering a plurality of the jots so as to facilitate color imaging therewith. Different colored filters can cover individual jots or groups of jots in the fashion of the Bayer filters that are used in contemporary color imaging sensors.

A digital processor can be configured to facilitate the generation of the image. Optionally, the digital processor can be integrated on the same chip as the jots. The processor can be configured to use an algorithm to form an image from a jot pattern. The algorithm can be dynamically varied so as to trade spatial resolution for light sensitivity. Thus, when less light is available the number of jots in a neighborhood can be increased. The processor can be configured to use a single or a plurality of readouts of the jots to form a single image.

A jot may comprise an integrating silicon photodetector, a high gain amplifier, a reset circuit, and a selection switch for reading out the jot. The imager can be made using a CMOS-compatible process. Each of the jots can have a total area less than 1 square micron.

A method for digital imaging can comprise setting a grain size digitally. The grain size can be set so as to be the smallest grain size that provides a picture having acceptable quality as measured using a parameter other than grain size. For example, the parameter can be intensity resolution.

The method can comprise digitally developing an image. The method can comprise using a plurality of jots in a manner that provides a desired balance between intensity resolution and spatial resolution. The method can comprise setting a grain size of an imager so as to provide a desired effective International Standards Organization (ISO) speed/resolution. The method can comprise selecting a grain size after exposure so as to enhance image quality. The method can comprise performing a region growing image processing function. The method can comprise determining a jot count of a grain based upon a light level. The method can comprise reading a plurality of jots more than once per exposure. Different jots can be read during each reading thereof.

The method can comprise adding exposures such that grain construct is both spatial and temporal. The method can comprise using different mapping on consecutive readouts so as to dither grain position. The method can comprise varying a grain size during a plurality of readouts of an exposure. The method can comprise mapping light density of exposed jots to define intensity. Light density of exposed jots with overlapping neighborhoods can be mapped to define intensity. Light density of exposed jots with non-overlapping neighborhoods can be mapped to define intensity. The method can comprise mapping jots to define a pixel image.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
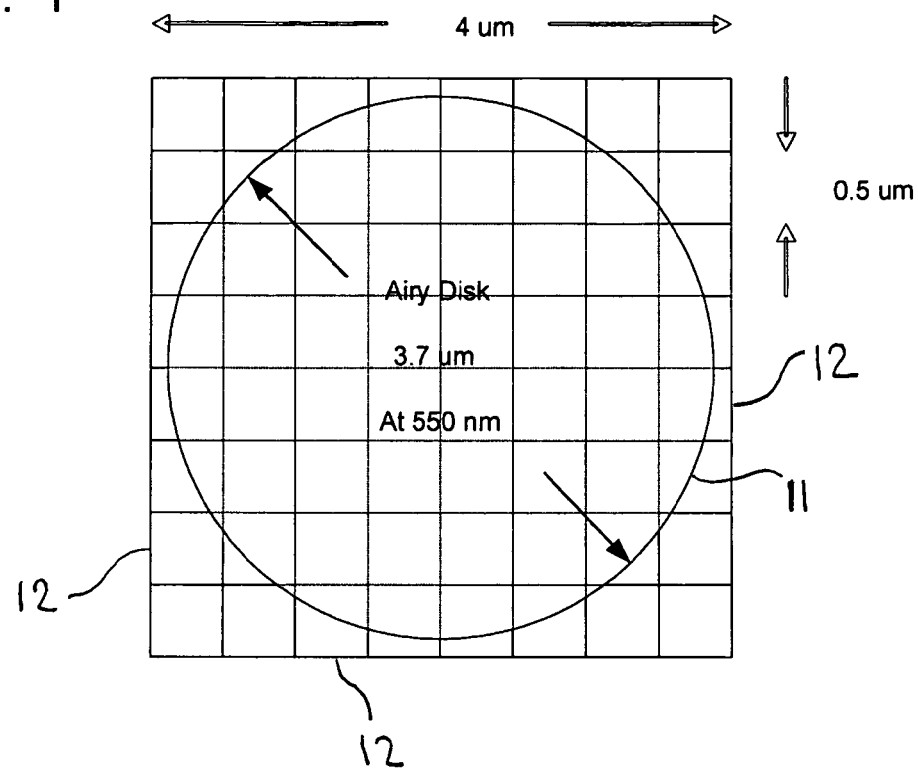
FIG. 1 is a diagram showing the relationship between the size of an exemplary Airy disk and exemplary SDL pixels.

Referring now to FIG. 1, the relationship between the size of an exemplary Airy disk 11, e.g., an Airy disk for light having a wavelength of 550 nm, and exemplary sub-diffraction-limit (SDL) pixels 12 is shown graphically. Airy disk 11 has a diameter of 3.7 µm. SDL pixels 12 are square and are 0.5 µm on a side. Of course, the actual size of an Airy disk depends upon the wavelength of light being used to form the Airy disk and the size of the SDL pixels can be larger or smaller than 0.5 µm. As can be seen the Airy disk 11 is substantially larger than each individual SDL pixel 12 and a plurality of SDL pixels 12 can thus fit within Airy disk 11.

According to an embodiment of the present invention, sub-diffraction-limit (SDL) pixels can be used in a new solid-state imaging paradigm. More particularly, SDL pixels can be used in a digital imaging emulation of the well known silver halide emulsion film process. The SDL pixels can be used in a binary mode to create a gigapixel digital film sensor (DFS).

According to an embodiment of the present invention, oversampling of the SDL pixels can be performed. For example, the optical resolution of an image can be highly oversampled. For SDL pixels, such oversampling can mitigate color aliasing problems, such as those that occur due to the use of color filter arrays. Further, a diffraction effect can be used to eliminate the need for anti-aliasing optical filters. For deep-SDL pixels (those SDL pixels having a diameter substantially less than one micron), improved resolution of the optical image can be achieved using digital signal processing.

According to an embodiment of the present invention, SDL pixels are used in the emulation of film. In film, silver halide (AgX) crystals form grains in the sub-micron to the several micron size range. A single photon striking the grain can result in the liberation of a single silver atom. This grain is effectively tagged as exposed and constitutes a latent image. In the subsequent wet chemical development process, the one silver atom results in a runaway feedback process that chemically liberates all the silver atoms in the exposed grain. This liberation of silver atoms leaves an opaque spot in the film, where the silver halide has been converted to metallic silver. Unexposed grains are washed away. The image intensity is thus proportional to a local density of silver grains.

Figure 2:
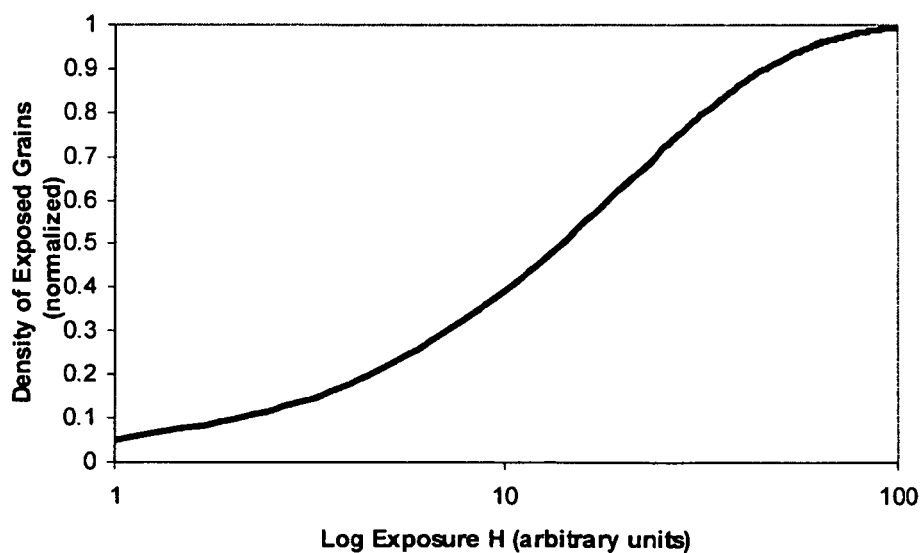
FIG. 2 is an exemplary chart showing the density of exposed grains versus exposure for film and digital sensors.

Referring now to FIG. 2, a chart shows the density of exposed grains versus the log exposure thereof for a typical silver halide emulsion film. As indicted by the chart, the probability that any particular grain is exposed under illumination grows linearly at first, but only eventually approaches unity. This process gives rise to film's particular D-log H contrast curve, where D is density and H is light exposure. The smaller the grain size, the lower the probability that the grain will be struck by a photon in a given exposure, and the slower the film speed will be since more light is required to ensure a high probability that all grains are struck by photons. However, the spatial resolution of the image is determined by grain size, with smaller grain sizes and slower film having higher image resolution.

In a developed film image, the grains are binary-like since they are either exposed or not exposed. The local image intensity is determined by the density of exposed grains, or in digital parlance, by the local spatial density of logical 1's.

According to an embodiment of the present invention, the concept of binary-like development of images in silver halide emulsion film is emulated to provide a digital film sensor (DFS). For example, an embodiment of the present invention can comprise an array of deep-SDL pixels. With sufficiently high conversion gain and sufficiently low readout noise, the presence of a single photoelectron can be determined.

In practice, several photoelectrons can contribute to pushing the output signal above some threshold. However, either single photon or multiple photon sensitivity can be used. From the discussion above, it is evident that a pixel that only needs to detect a single photoelectron has much lower performance requirements for full-well capacity and dynamic range than an analog pixel in a conventional image sensor.

According to one or more embodiments of the present invention, the implementation of a jot can be accomplished is any of several ways. A brute force approach can be to make a conventional active pixel with very high conversion gain (low capacitance). Other approaches include using avalanche or impact ionization effects to achieve in-pixel gain, as well as the possible application of quantum dots and other nanoelectronics devices to define the jots. Stacked structures are also possible, especially since performance requirements are reduced. Of course, it is generally desirable to minimize dark current.

At the start of the exposure period, the jot can be reset to a logical '0'. If the jot is subsequently hit by a photon during an exposure, then the jot is set to a logical '1', either immediately or upon readout. This can be accomplished in a fashion analogous to that performed with memory chips that have been used as image sensors. Due to the single-bit nature of the analog-to-digital conversion resolution, high row-readout rates can be achieved, thus facilitating scanning of a gigapixel sensor having approximately 50,000 rows in milliseconds and thereby enabling multiple readouts per exposure or frame.

The read out binary image can be digitally developed to provide a conventional image having somewhat arbitrary pixel resolution. Such development can be accomplished using a two step process. According to this two step process, image intensity resolution can be traded for spatial resolution.

Figure 3:
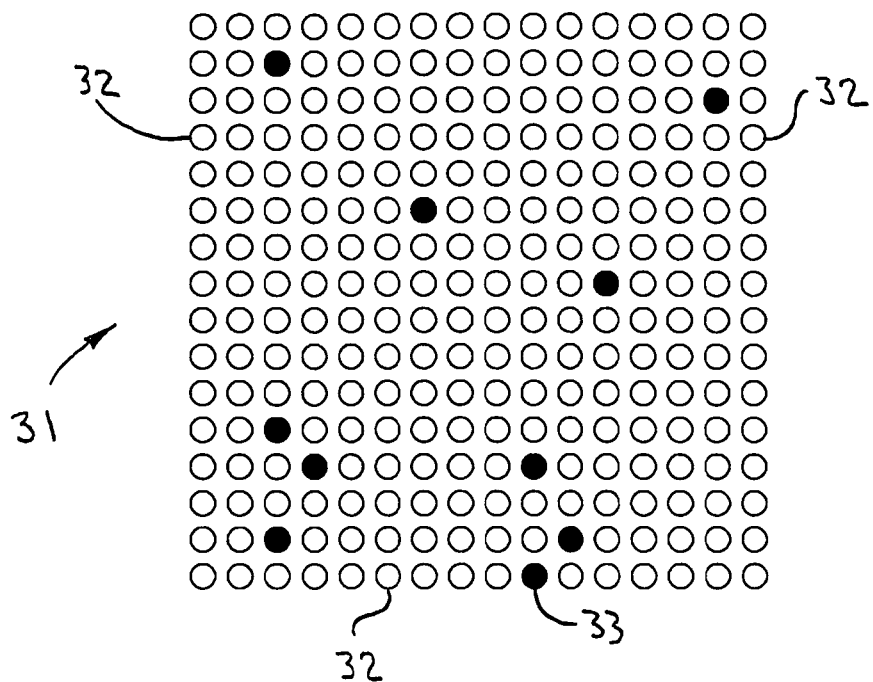
FIG. 3 is a semi-schematic diagram showing an exemplary array of jots according to an embodiment of the present invention, wherein a plurality of the jots have registered photon hits.

Referring now to FIG. 3, a representative portion of an exemplary digital film sensor (DFS) can comprise a plurality of jots 32 arranged in an array 31 according to an embodiment of the present invention. Exposed jots 33 are indicated as being black. Either one photon or a plurality of photon may be required to expose a jot.

Figure 4:
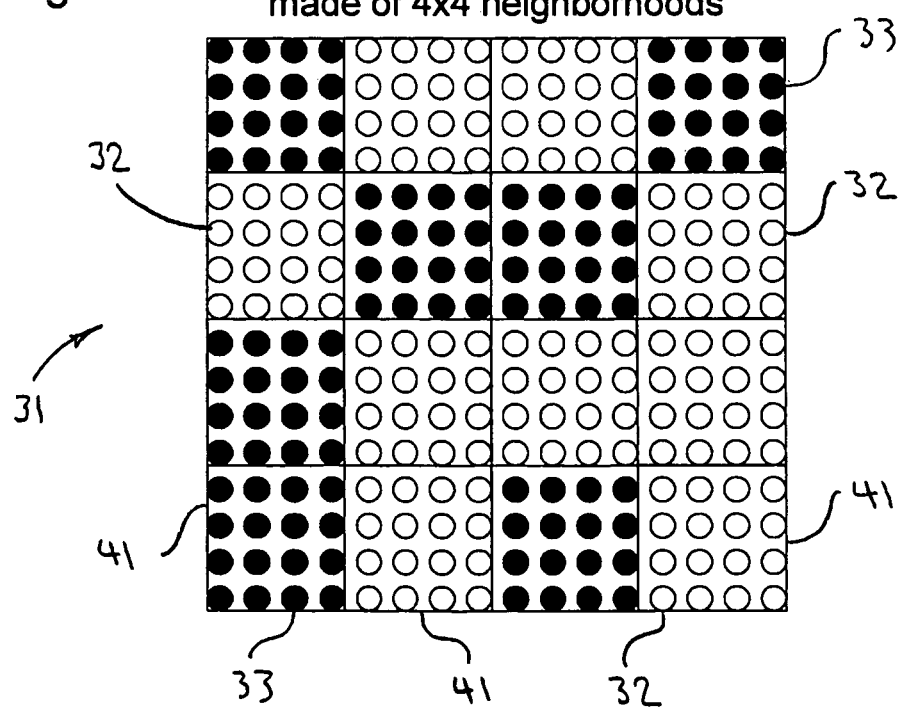
FIG. 4 is a semi-schematic diagram showing the array of FIG. 3, wherein the jots have been digitally developed using 4×4 neighborhoods according to an embodiment of the present invention.

Referring now to FIG. 4, a neighborhood 41 can be defined herein as being comprised of a group of jots. Each neighborhood of FIG. 4 is a 4×4 array of jots. Thus, each 4×4 array of FIG. 4 defines one neighborhood 41. Alternatively, a neighborhood can comprise any other number, e.g., 2, 3, 5, 20, 100, of jots. Indeed, a neighborhood can even comprise a single jot, if desired.

Each neighborhood is at least somewhat analogous to a grain of contemporary silver halide film. The terms neighborhood and grain can thus generally be used interchangeably herein.

According to one embodiment of the present invention, if any jot in a grain or neighborhood 41 has been hit by a photon and is a logical '1', the neighborhood is considered exposed and all jots in the neighborhood are set to '1'. The digital development process allows the flexibility of setting a grain or neighborhood size during readout to adjust the effective speed, e.g. International Standards Organization (ISO) speed of the DFS.

Figure 5:
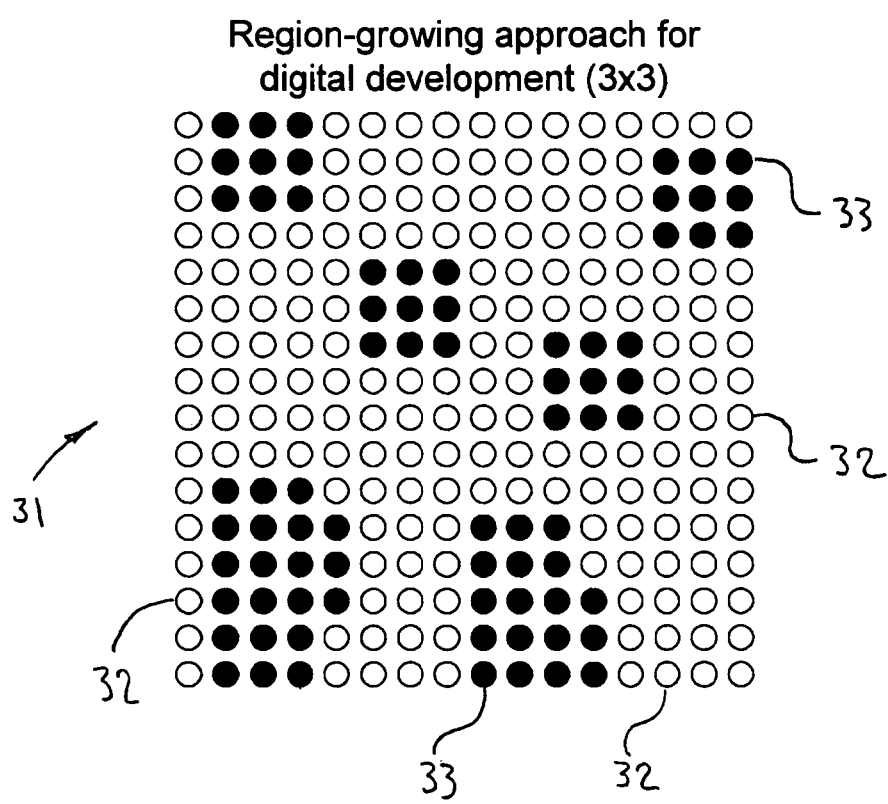
FIG. 5 is a semi-schematic diagram showing the array of FIG. 3, wherein the jots have been digitally developed using 3×3 neighborhoods according to an embodiment of the present invention.

Referring now to FIG. 5, according to an embodiment of the present invention a region-growing approach can be used for digital development. Different sizes of neighborhoods can be tried during an exposure. Alternatively, the size of a neighborhood 41 can be selected to optimize image quality after the exposure.

Thus, the first step of digital development can be performed as a region-growing image processing function. In any case, the development can be accomplished in a jot area-amplification fashion. This first step of digital development can be used in very high jot-count image sensors under low light conditions and corresponds to large-grain film emulsions for very high film speed.

Unlike film where the grain boundaries are fixed during an exposure, it is possible to provide an imaging process where the jots are read out several times during a single exposure. The exposures can be added (logically 'OR'd) together so that the grain construct is both spatial and temporal.

The neighborhood mapping function can be different for each readout. That is, the number and/or location of jots in each neighborhood can be different for each readout. The use of different neighborhood mapping functions for each readout is somewhat analogous to dithering the grain position in a film emulsion during exposure, and perhaps even varying the grain size during the exposure.

In the second step of digital development, the grains which form a binary image can be converted to a conventional digital image that contains pixels with intensity values between 0 and 255, for example. In this case, a local density of exposed grains can be mapped into a pixel image. The more exposed grains in a neighborhood, the higher the pixel value.

Neighborhoods can overlap or can be distinct. If they overlap, this second step is like a blurring convolution process followed by subsampling. At high magnification, a conventional film image appears to be binary due to the presence or absence of silver grains. But, at the lower magnifications used for digitizing film, the same image appears as a continuous gray tone that can be digitized into an array of pixels.

According to an embodiment of the present invention, digital color imaging can be performed in a manner analogous to the procedure used in contemporary color image sensors. Jots can be covered with color filters. Red (R), green (G), and blue (B) jots can be treated separately and later the digitally-developed images combined to form a conventional RGB image. R, G, and B jots need not appear at the same spatial. frequency, and since the deep-SDL nature of the jot pitch results in blurring from diffraction effects, color aliasing is not an issue.

Like film, we expect such a jot-based DFS to exhibit D-log H exposure characteristics. This is true because the physics and mathematics of jot exposure are nominally very similar to those of film. The dynamic range can be large and the exposure characteristics more appealing for photographic purposes.

The DFS imaging may be superior to contemporary imaging techniques. One or more embodiments of the present invention provide for the use of deep-SDL pixels and introduce a paradigm shift with respect to contemporary solid-state image sensors. Pixel sizes can be measured in nanometers, conversion gain becomes extremely large, charge-handling capacity can be minute, and pixel resolution can be increased by orders of magnitude.

Figure 6:
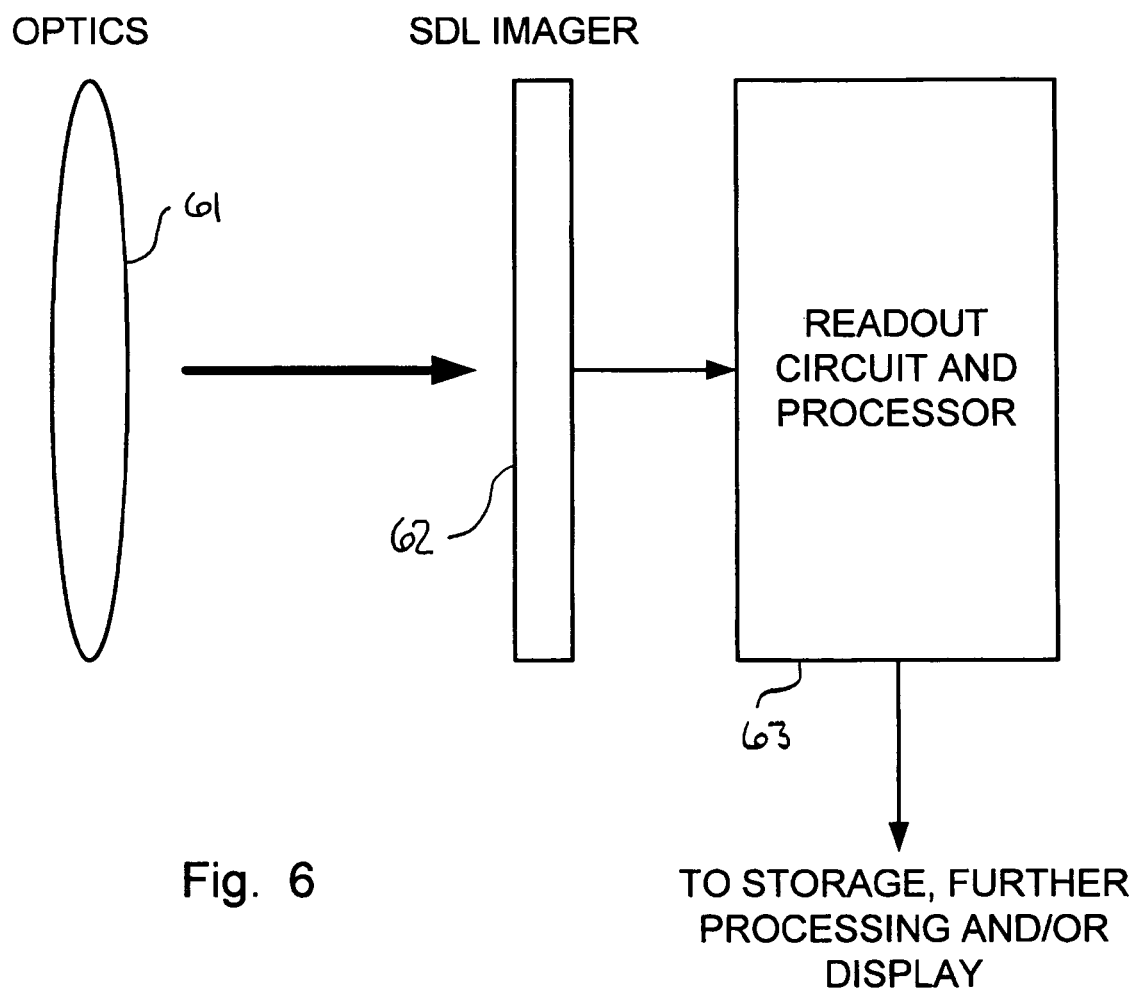
FIG. 6 is a semi-schematic diagram showing an imaging system comprising an SDL imager and a readout circuit/processor according to an embodiment of the present invention.

Referring now to FIG. 6, an SDL imaging system is shown. According to an embodiment of the present invention, light from a subject passes through optics 61 and is incident upon SDL imager 62. SDL imager 62 comprises a plurality of jots that can be organized into neighborhoods so as to emulate, at least to a degree, the effect of grain structure in contemporary silver halide film.

Such organization of the jots into neighborhoods can be performed by readout circuit and processor 63, as discussed in detail above. Information from readout circuit and processor 63 can be provided to a memory for storage, to another processor for further processing (color balance, compression, etc.) and/or to a display.

One or more embodiments of the present invention provide applications for SDL pixels. More particularly, one or more embodiments of the present invention provide a method for providing a digital film sensor that emulates, at least to some degree, contemporary silver halide film.

Embodiments described above illustrate, but do not limit, the invention. It should also be understood that numerous modifications and variations are possible in accordance with the principles of the present invention. Accordingly, the scope of the invention is defined only by the following claims.

I claim:

1. A method of operation within imaging integrated-circuit (IC) having a plurality of sub-diffraction-limit (SDL) pixels disposed within an array, the method comprising:
   generating, during an image frame interval, a respective plurality of digital samples for each of the SDL pixels; and
   combining the plurality of digital samples generated for a first one of the SDL pixels with the plurality of digital samples generated for at least one other of the SDL pixels to produce a first multi-bit pixel value that constitutes one of a plurality of multi-bit pixel values within an output image for the image frame interval.

2. The method of claim 1 wherein generating the respective plurality of digital samples for each of the SDL pixels comprises enabling a first one of the SDL pixels to output, for each of a plurality of sub-intervals within the image frame interval, a respective analog signal indicative of photocharge accumulated within a light-sensitive element of the SDL pixel during the sub-interval.

3. The method of claim 2 wherein generating the respective plurality of digital samples for each of the SDL pixels comprises digitizing the respective analog signal output for each of the plurality of sub-intervals to produce the plurality of digital samples for the first one of the SDL pixels.

4. The method of claim 1 wherein generating the respective plurality of digital samples for each of the SDL pixels comprises generating, for each of the SDL pixels, a respective sequence of digital samples corresponding to successive sub-intervals of the image frame interval.

5. The method of claim 1 wherein combining the plurality of digital samples generated for the first one of the SDL pixels with the plurality of digital samples generated for at least one other of the SDL pixels comprises combining the plurality of digital samples generated for the first one of the SDL pixels with the plurality of digital samples generated for each of a number of others of the SDL pixels, and determining the number of others of the SDL pixels after generation of the plurality of digital samples for each of the SDL pixels.

6. The method of claim 5 wherein determining the number of others of the SDL pixels comprises generating a plurality of combination values that correspond to respective combinations of the plurality of digital samples generated for the first one of the SDL pixels with pluralities of digital samples generated for different quantities of the others of the SDL pixels and selecting the number of others of the SDL pixels based at least in part on the plurality of combination values.

7. The method of claim 6 wherein selecting the numbers of others of the SDL pixels based at least in part on the plurality of combination values comprises comparing image resolutions corresponding to the different quantities of the others of SDL pixels.

8. The method of claim 1 wherein each of the plurality of SDL pixels is disposed within a respective area less than that of a 3.7 μm-diameter Airy disk.

9. The method of claim 1 wherein generating a respective plurality of digital samples for each of the SDL pixels comprises generating N digital samples for each of the SDL pixels, with each of the N digital samples comprising a bit quantity, B, and wherein combining the plurality of digital samples comprises combining the N digital samples for the first one of the SDL pixels with the N digital samples generated for each of M other of the SDL pixels to produce the first multi-bit pixel value, where the product of N and M is at least forty.

10. An imaging integrated-circuit (IC) comprising:
    a plurality of sub-diffraction-limit (SDL) pixels disposed within an array; and
    a readout circuit to:
      generate, during an image frame interval, a respective plurality of digital samples for each of the SDL pixels; and
      combine the plurality of digital samples generated for a first one of the SDL pixels with the plurality of digital samples generated for at least one other of the SDL pixels to produce a first multi-bit pixel value that constitutes one of a plurality of multi-bit pixel values within an output image for the image frame interval.

11. The imaging IC of claim 10 wherein the readout circuit to generate the respective plurality of digital samples for each of the SDL pixels comprises circuitry to enable a first one of the SDL pixels to output, for each of a plurality of sub-intervals within the image frame interval, a respective analog signal indicative of photocharge accumulated within a light-sensitive element of the SDL pixel during the sub-interval.

12. The imaging IC of claim 11 wherein the readout circuit to generate the respective plurality of digital samples for each of the SDL pixels comprises circuitry to digitize the respective analog signal output for each of the plurality of sub-intervals to produce the plurality of digital samples for the first one of the SDL pixels.

13. The imaging IC of claim 10 wherein the readout circuit to generate the respective plurality of digital samples for each of the SDL pixels comprises circuitry to generate, for each of the SDL pixels, a respective sequence of digital samples corresponding to successive sub-intervals of the image frame interval.

14. The imaging IC of claim 10 wherein the first one of the SDL pixels and the at least one other of the SDL pixels are co-located within a spatial region of the array smaller than or equal to a 3.7 µm-diameter Airy disk.

15. The imaging IC of claim 10 wherein the readout circuit to combine the plurality of digital samples generated for the first one of the SDL pixels with the plurality of digital samples generated for at least one other of the SDL pixels comprises circuitry to combine the plurality of digital samples generated for the first one of the SDL pixels with the plurality of digital samples generated for each of a number of others of the SDL pixels, and to determine the number of others of the SDL pixels after generation of the plurality of digital samples for each of the SDL pixels.

16. The imaging IC of claim 15 wherein the circuitry to determine the number of others of the SDL pixels comprises circuitry to generate a plurality of combination values that correspond to respective combinations of the plurality of digital samples generated for the first one of the SDL pixels with pluralities of digital samples generated for different quantities of the others of the SDL pixels and to select the number of others of the SDL pixels based at least in part on the plurality of combination values.

17. The imaging IC of claim 16 wherein the circuitry to select the numbers of others of the SDL pixels based at least in part on the plurality of combination values comprises circuitry to comparing image resolutions corresponding to the different quantities of the others of SDL pixels.

18. The imaging IC of claim 10 wherein each of the plurality of SDL pixels is disposed within a respective area less than that of a 3.7 µm-diameter Airy disk.

19. The imaging IC of claim 10 wherein the readout circuit to generate a respective plurality of digital samples for each of the SDL pixels and to combine the plurality of digital samples comprises circuitry to (i) generate N digital samples for each of the SDL pixels, with each of the N digital samples comprising a bit quantity, B; and (ii) combine the N digital samples for the first one of the SDL pixels with the N digital samples generated for each of M other of the SDL pixels to produce the first multi-bit pixel value, where the product of N and M is at least forty.

20. An imaging integrated-circuit (IC) comprising:
a plurality of sub-diffraction-limit (SDL) pixels disposed within an array;
means for generating, during an image frame interval, a respective plurality of digital samples for each of the SDL pixels; and
means for combining the plurality of digital samples generated for a first one of the SDL pixels with the plurality of digital samples generated for at least one other of the SDL pixels to produce a first multi-bit pixel value that constitutes one of a plurality of multi-bit pixel values within an output image for the image frame interval.

* * * * *